(12) United States Patent
Fullerton et al.

(10) Patent No.: US 7,372,116 B2
(45) Date of Patent: May 13, 2008

(54) HEAT ASSISTED SWITCHING IN AN MRAM CELL UTILIZING THE ANTIFERROMAGNETIC TO FERROMAGNETIC TRANSITION IN FERH

(75) Inventors: Eric Edward Fullerton, Morgan Hill, CA (US); Stefan Maat, San Jose, CA (US); Jan-Ulrich Thiele, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 117 days.

(21) Appl. No.: 10/869,315

(22) Filed: Jun. 16, 2004

(65) Prior Publication Data

US 2005/0281081 A1 Dec. 22, 2005

(51) Int. Cl.
*H01L 29/82* (2006.01)
*G11C 11/14* (2006.01)

(52) U.S. Cl. .............................. 257/421; 257/E21.665; 365/171; 428/800

(58) Field of Classification Search ............... 257/421, 257/E21.665; 428/800; 365/171
See application file for complete search history.

(56) References Cited

U.S. PATENT DOCUMENTS

| | | | | |
|---|---|---|---|---|
| 3,607,460 A | * | 9/1971 | Lommel | 148/306 |
| 3,741,823 A | * | 6/1973 | Lommel | 148/103 |
| 5,640,343 A | | 6/1997 | Gallagher et al. | 365/171 |
| 5,953,248 A | * | 9/1999 | Chen et al. | 365/158 |
| 6,146,775 A | * | 11/2000 | Fujita et al. | 428/811.2 |
| 6,385,082 B1 | | 5/2002 | Abraham et al. | 365/171 |
| 6,518,588 B1 | | 2/2003 | Parkin et al. | 257/3 |
| 6,567,299 B2 | * | 5/2003 | Kunikiyo et al. | 365/173 |
| 6,603,678 B2 | | 8/2003 | Nickel et al. | 365/171 |
| 6,653,704 B1 | | 11/2003 | Gurney et al. | 257/421 |
| 6,714,444 B2 | * | 3/2004 | Huai et al. | 365/171 |
| 6,731,479 B2 | * | 5/2004 | Ooshima et al. | 360/324.12 |
| 6,784,509 B2 | * | 8/2004 | Yuasa et al. | 257/421 |
| 7,038,939 B2 | * | 5/2006 | Amano et al. | 365/158 |
| 2002/0036877 A1 | * | 3/2002 | Sakakima et al. | 360/324.11 |
| 2002/0098974 A1 | | 7/2002 | Nickel et al. | 365/171 |
| 2002/0191355 A1 | * | 12/2002 | Hiramoto et al. | 360/324.2 |
| 2003/0011947 A1 | * | 1/2003 | Saito et al. | 360/324.11 |
| 2003/0062981 A1 | * | 4/2003 | Hosomi et al. | 336/200 |
| 2003/0108721 A1 | | 6/2003 | Fullerton et al. | 428/195 |
| 2003/0123282 A1 | | 7/2003 | Nickel et al. | 365/158 |

(Continued)

OTHER PUBLICATIONS

Kouvel, J. S. "Unusual Nature of the Abrupt Magnetic Transition in FeRh and Its Pseudobinary Variants." J. Appl. Phys. 37 (1966): 1257-1258.*
Farrow, R. F. C. et al. "MnxPt1-x: A New Exchange Bias Material for Permalloy." J. Appl. Phys. 81 (1997): 4986-4988.*
Annaorazov, M. P. et al. "Anomalously High Entropy Change in FeRh Alloy." J. Appl. Phys. 79 (1996): 1689-1695.*
J.M. Daughton and A.V. Pohm, "Design of Curie Point Written Magnetoresistance Radom Access Memory Cells," May 15, 2003, vol. 93, No. 10, Journal of Applied Physics.

*Primary Examiner*—B. William Baumeister
*Assistant Examiner*—Matthew W. Such
(74) *Attorney, Agent, or Firm*—Zilka-Kotab, PC (57) ABSTRACT

A magnetic memory cell for use in a magnetic random access memory array that uses the antiferromagnetic to ferromagnetic transition properties of FeRh to assist in the control of switching of the memory cell.

28 Claims, 4 Drawing Sheets

U.S. PATENT DOCUMENTS

| | | | |
|---|---|---|---|
| 2003/0152805 A1* | 8/2003 | Bertero et al. | 428/692 |
| 2003/0179071 A1* | 9/2003 | Hiramoto et al. | 338/32 R |
| 2003/0198113 A1 | 10/2003 | Abraham et al. | 365/211 |
| 2004/0136231 A1* | 7/2004 | Huai et al. | 365/158 |
| 2004/0165428 A1* | 8/2004 | Odagawa et al. | 365/171 |
| 2005/0041335 A1* | 2/2005 | Kikitsu et al. | 360/110 |
| 2005/0098809 A1* | 5/2005 | Katti | 257/295 |
| 2005/0129984 A1* | 6/2005 | Bertero et al. | 428/694 TM |
| 2005/0170533 A1* | 8/2005 | Lee et al. | 438/3 |
| 2005/0237787 A1* | 10/2005 | Huai et al. | 365/158 |

* cited by examiner

HEAT ASSISTED SWITCHING IN AN MRAM CELL UTILIZING THE ANTIFERROMAGNETIC TO FERROMAGNETIC TRANSITION IN FERH

FIELD OF THE INVENTION

The present invention relates to magnetic random access memory (MRAM) storage systems and more particularly to the use of a magnetic memory that utilizes antiferromagnetic to ferromagnetic transition properties of FeRh to control switching of a memory cell.

BACKGROUND OF THE INVENTION

The desired characteristics of a memory system for computer main memory are high speed, low power, nonvolatility, and low cost. Low cost is accomplished by a simple fabrication process and a small surface area. Dynamic random access memory (DRAM) cells are fast and expend little power, but have to be refreshed many times each second and require complex structures to incorporate a capacitor in each cell. Flash type EEPROM cells are nonvolatile, have low sensing power, and can be constructed as a single device, but take microseconds to write and milliseconds to erase, which makes them too slow for many applications, especially for use in computer main memory. Conventional semiconductor memory cells such as DRAM, ROM, and EEPROM have current flow in the plane of the cell, i.e., "horizontal", and therefore occupy a total surface area that is the sum of the essential memory cell area plus the area for the electrical contact regions, and therefore do not achieve their theoretical minimum cell area.

Unlike DRAM, magnetic memory cells that store information as an orientation of magnetization of a ferromagnetic region can hold stored information for long periods of time, and are thus nonvolatile. Certain types of magnetic memory cells that use the magnetic state to alter the electrical resistance of the materials near the ferromagnetic region are collectively known as magnetoresistive (MR) memory cells. An array of magnetic memory cells is often called magnetic RAM or MRAM.

Although many types of MR cells have been proposed for use in MRAM arrays, magnetic tunnel junction sensors (MTJ), also called tunnel valves, have shown the most promise. A magnetic tunnel junction (MTJ) includes two ferromagnetic layers separated by a non-magnetic, electrically insulating barrier layer, and the magnetoresistance results from the spin-polarized tunneling of conduction electrons between the two ferromagnetic layers. The tunneling current depends on the relative orientation of the magnetic moments of the two ferromagnetic layers. For example, when the magnetizations of the two ferromagnetic layers are parallel, electrical resistance through the sensor is at a minimum, and, conversely when the magnetizations of the ferromagnetic layers are antiparallel, the electrical resistance is at its maximum.

A MTJ cell used in a MRAM array generally has one of its ferromagnetic layers pinned in a desired direction (such as by exchange coupling with an anitferromagnetic material), while the other is free to rotate in response to a magnetic field. The MTJ cell may be designed so that the free ferromagnetic layer has a magnetic anisotropy, such as a shape induced anisotropy, that causes the magnetization of the free layer to tend to align in one of two directions, either parallel to the magnetization of the pinned layer or antiparallel to the magnetization of the pinned layer.

The MRAM array has a first set of parallel electrical lines that can be referred to as word lines and a second set of parallel electrical lines, termed bit lines, that are generally perpendicular to the word lines. Each MTJ cell connects a word line with a bit line. Conducting electrical currents in the word and bit lines associated in a particular cell generates magnetic fields that can be used to flip the magnetization of the free ferromagnetic layer, thereby switching the cell between a high and low resistance state as desired.

In order to provide effective non-volatile memory, the switched state of the MTJ cell must remain in its desired position, until it is desired that it be switched. However, the anisotropy energy of the free layer is often not sufficient to ensure that the cell will remain in its desired state. For example, magnetic stray fields from adjacent cells and lines can, in combination with thermal fluctuations, cause the free layer to spontaneously flip.

In order to overcome this problem, some researches have attempted to develop thermally assisted MRAM systems. An example of cell 100 from such a system can be seen with reference to FIG. 1. The cell includes a first magnetic layer FM1 102 that is exchange coupled to a layer of antiferromagnetic material 104 and second ferromagnetic layer FM2 106. The Curie temperatures of both ferromagnetic layers 102 and 106 ($T_{C1}$ and $T_{C2}$, respectively) are significantly higher than the blocking temperature of the antiferromagnetic layer 104 ($T_B$). The blocking temperature of the antiferromagnetic material is that temperature at which the material ceases to exchange bias the ferromagnetic layer and often corresponds with the loss of antiferromagnetic order. A barrier layer 110 is sandwiched between the first and second ferromagnetic layers 104 and 106. An electrically conductive word line 112 and a perpendicular, electrically conductive bit line 114 (shown in cross section) are provided at opposite ends of the memory cell 100.

Figure 1:
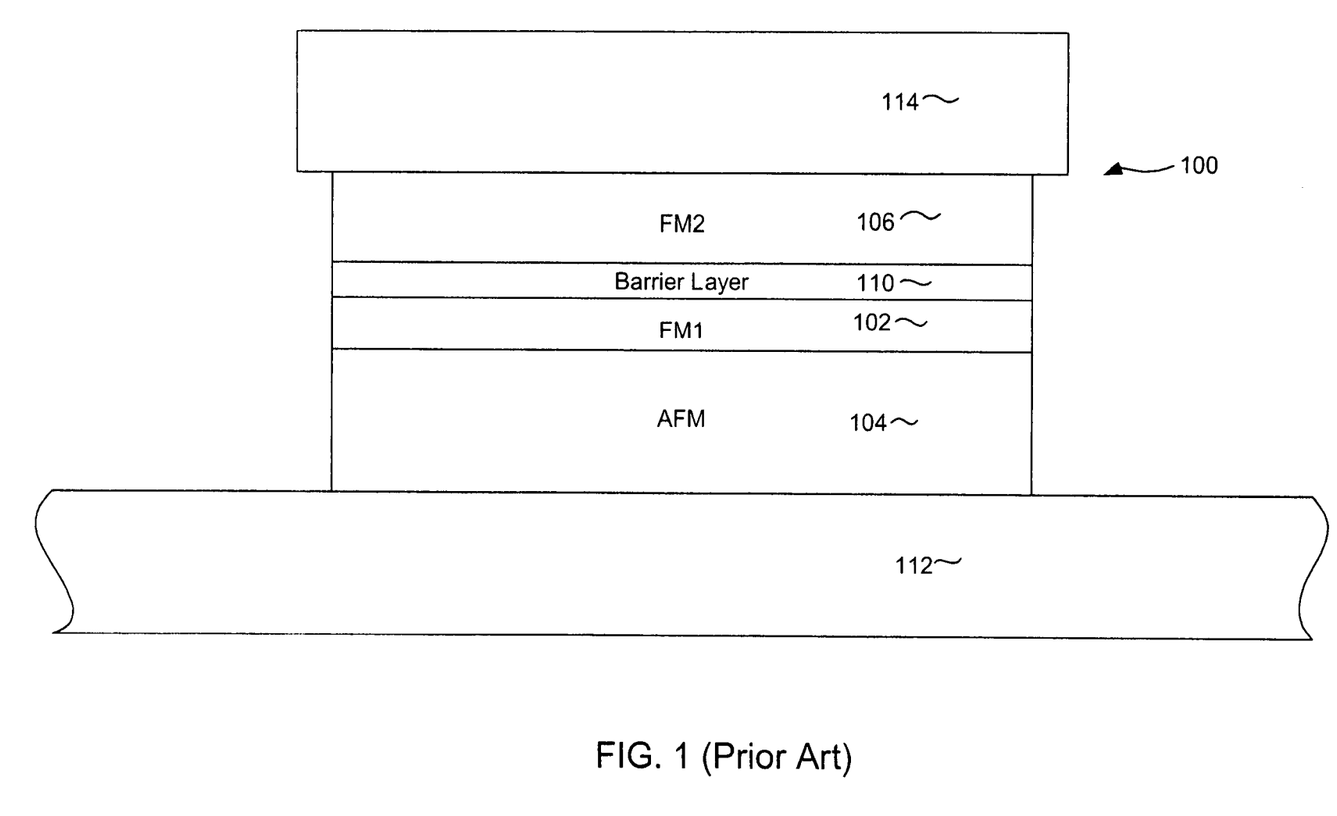
FIG. 1 is a side view of a prior art magnetic memory cell.

Those familiar with spin valve sensors will recognize the disclosed structure as being similar to a tunnel valve sensor designed for use in a hard disk drive wherein the second ferromagnetic layer 106 serves as a free layer and the first magnetic layer 102 serves as a pinned layer. However, in the presently described memory cell 100, the second ferromagnetic layer 106 exhibits sufficiently high magnetic coercivity to maintain the magnetization of the second magnetic layer fixed in a desired position even in the presence of magnetic fields from the word and bit lines 112, 114. Above $T_B$ the first ferromagnetic layer 102 exhibits low enough coercivity, so that its magnetization can be switched in the presence of magnetic fields from the word and bit lines 112, 114, while layer 106 exhibits high enough coercivity, so that its magnetization cannot be switched in the presence of magnetic fields from the word and bit lines 112, 114. When it is desired that the memory cell be switched from one memory state to another, heat can be provided by a heat source (not shown) to heat the memory cell to a temperature $T_W$ above the blocking temperature $T_B$ of the antiferromagnetic material 104, but below the Curie temperatures $T_{C1}$ and $T_{C2}$ of the two ferromagnetic layers 102 and 106 Heat can be provided by flowing a current through the word and bit lines 112, 114 or by an external heat source such as a laser or resistive heater. When $T_W$ is reached the strong pinning provided by the AFM layer 104 ceases and the magnetic state of the first magnetic layer 102 can be switched by magnetic fields from the word and bit lines. Once the magnetic state has been switched, the cell 100 is cooled below the blocking temperature of the AFM layer 104 and the first magnetic layer 102 is again strongly pinned by exchange coupling with the AFM layer 104. With the magnetization of the first and second magnetic layers strongly fixed, inadvertent flipping of the memory state of the sensor is avoided. A memory cell similar to that described above is described by J. M. Daughton and A.V. Pohm in the Journal of Applied Physics Volume 93, Number 10 pages 7304 through 7306 (15 May 2003).

While the above described heat assisted memory cell 100 effectively prevents flipping of the memory state, it does suffer from other drawbacks. For one thing, in order to achieve good pinning at room temperature an AFM with high blocking temperature needs to be employed. The reason is that the pinning strength of the antiferromagnet does not vanish instantaneously at a given temperature, but rather decreases almost linearly over a large temperature range. By way of example, the blocking temperature $T_B$ of 20 nm thick IrMn is ~550 Kelvin. $T_B$ decreases with decreasing IrMn thickness, however the pinning at room temperature will generally also be lower and pinning still decreases over a large temperature range. Since good pinning at room temperature is desired, an antiferromagnetic layer with blocking temperature much higher than room temperature is preferred. Heating above and cooling back down from such a high blocking temperature takes a significant amount of time and requires a powerful heat source. This prior art concept thus requires heating the cell 100 well above the blocking temperature of the AFM layer 104 in order to ensure that the ferromagnetic layer 102 will be able to be switched. Therefore, the point of switching cannot be well controlled, and the process is undesirably slow.

Therefore, there remains a need for a magnetic memory cell having a well maintained magnetic memory state that can also be switched quickly. Such a memory cell would preferably not require heating to excessively high temperatures and would be able to be very quickly switched, preferably on timescales of the order of nanoseconds or below.

SUMMARY OF THE INVENTION

The present invention provides a memory cell for use in a magnetic random access memory array. The memory cell includes first and second magnetic layer structures separated by a barrier layer. The first magnetic layer structure includes a ferromagnetic layer exchange coupled with a layer of FeRh. The ferromagnetic layer in contact with the FeRh layer is magnetically hard. The magnetization of the second magnetic layer structure is fixed, such as by exchange coupling with a hard magnetic material or an antiferromagnetic AFM material layer.

The FeRh has the advantageous property that it very quickly switches from being antiferromangetic to being ferromagnetic at a given temperature that is much lower than the blocking temperature of many antiferromagnetic materials. This transition happens extremely quickly, on the order of picoseconds and happens at a temperature close to room temperature. When the FeRh is in its antiferromagnetic state the coercivity of the bilayer is determined predominantly by the hard magnetic layer, however, upon heating the FeRh through the antiferromagnetic-ferromagnetic transition the additional moment of the FeRh layer assists magnetization reversal, and the coercivity of the FeRh/hard magnet bilayer decreases dramatically.

Advantageously, the temperature at which this transition occurs can be modified to meet design requirements simply by adding certain materials to the FeRh layer. For example, adding Ir or Pt increases the transition temperature, whereas adding Pd decreases the transition temperature. Since the transition happens so quickly, heating to only a few degrees above the transition temperature is required. Other features and advantages of the invention will be understood upon reading of the following detailed description taken in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 2:
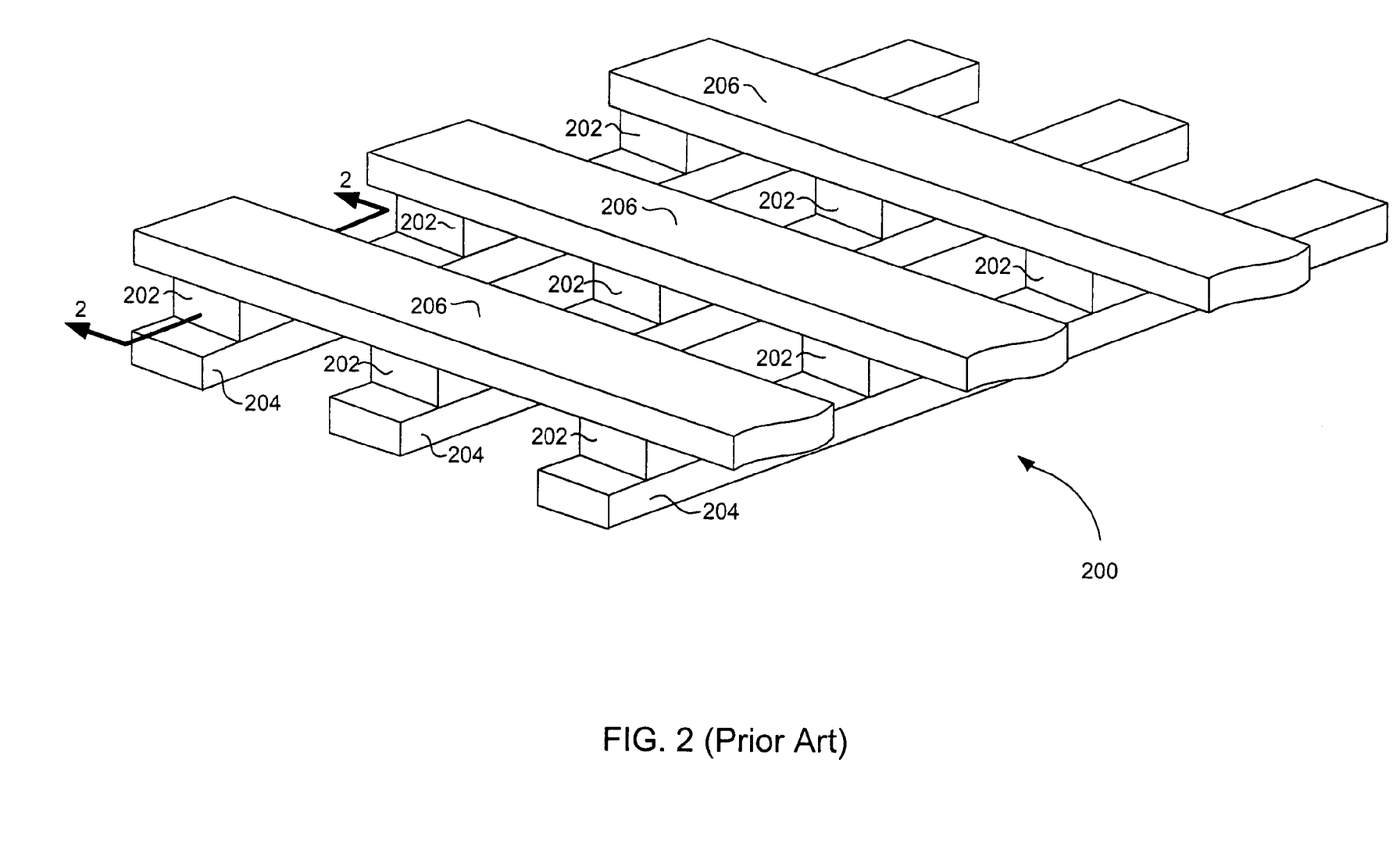
FIG. 2 is a perspective view of a portion of a magnetic random access memory array according to an embodiment of the present invention.

With reference now to FIG. 2, a magnetic random access memory array 200 includes a plurality of memory cells 202 positioned at intersections of an exemplary rectangular grid of electrically conductive word lines 204 and bit lines 206. The word lines 204 are arrayed as parallel lines in a first plane, and the bit lines 206 are arrayed in parallel lines, perpendicular to the word lines in a second plane. Each memory cell 202 connects one word line 204 with a bit line 206, bridging the space between the planes of the word lines and bit lines at the intersection of the word and bit line 204, 206. Although three word lines and three bit lines are shown in FIG. 2, this is for purposes of illustration only and the actual number of word lines 204, bit lines 206 and memory cells 208 would be much larger.

During sensing of a sensing or reading operation of the array, current flows in a vertical direction through the cell 202. The vertical current path through the cell 202 permits the memory cell to occupy a very small surface area. The array may be formed on a substrate (not shown), which contains other circuitry. The memory cell is a magnetoresistive cell that has high and low resistance states (i.e. on and off) that correlate to the magnetic state of layers within the sensor. The memory state of the sensor 202 can be switched by conducting a current through the word and bit lines 204, 206 associated with a particular memory cell 202 to thereby cause magnetic fields to emanate from the particular word and bit lines 204, 206. This switching process will be discussed in more detail below after further discussion of the structure of the cell 202.

Figure 3:
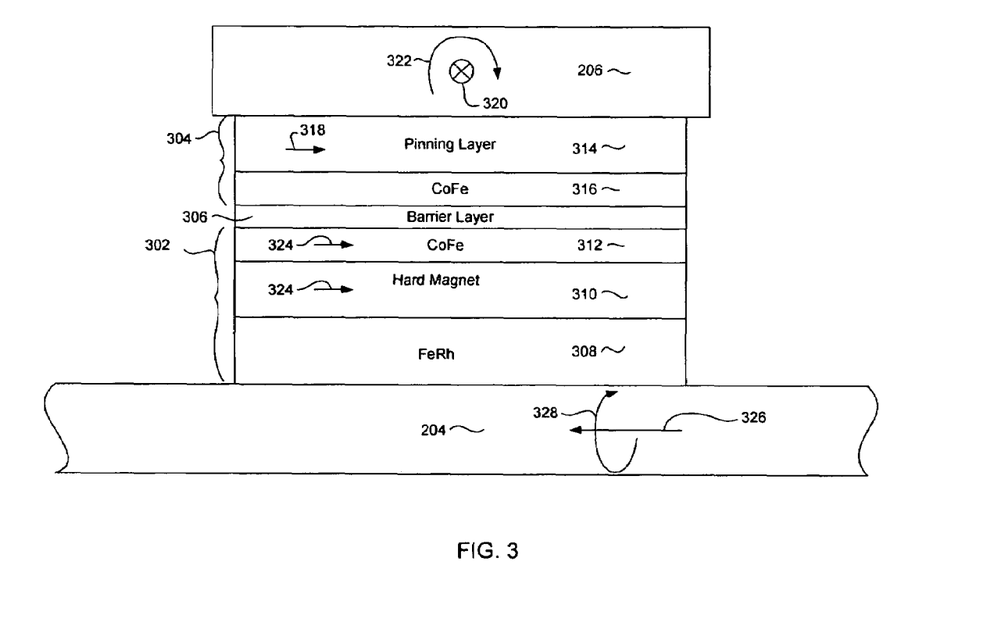
FIG. 3 is a side view of a magnetic memory cell according to an embodiment of the invention.

With reference now to FIG. 3, a memory cell 202 according to one possible embodiment of the invention can be seen in more detail. The memory cell 202 is sandwiched between and electrically connects a word line 204 and a bit line 206. The memory cell 202 includes a first magnetic layer structure 302, a second magnetic layer structure 304 and a barrier layer 306 sandwiched between the first and second magnetic layers 302, 304. The barrier layer 306 is preferably a non-magnetic electrically insulating material such as for example $Al_2O_3$. It should be pointed out that although this embodiment of the invention is being described as a tunnel junction sensor, the present invention could also be practiced with a GMR sensor or spin valve in which case the barrier layer 306, would be an electrically conductive, non-magnetic spacer layer such as Cu.

The first magnetic layer 302 includes a layer of FeRh 308 and a magnetically hard, i.e. high anisotropy ferromagnetic layer 310 formed thereabove. Suitable high anisotropy materials are the chemically ordered $L1_0$ alloys such as CoPt or FePt, CoPd, or FePd or alloys thereof which has the c-axis in the plane or a projection of the c-axis in the film plane. Other suitable materials are alloys with a hexagonal crystal structure such as CoPt, CoPtCr, or CoPtCrB, or other Co or Fe based alloys with anisotropy constant sufficient to stabilize the bit against thermal fluctuation.

A ferromagnetic layer 312 comprising a high spin polarization material such as CoFe, a full or half Heusler alloy such as NiMnSb, PtMnSb, or other high spin polarization material may be formed on top of the magnetic layer 310 (closest to the barrier layer 306) to improve spin dependent tunneling performance of the sensor 202. Alternatively, the hard magnetic layer 310 and high spin polarization layer 312 could be formed as a single layer, which could comprise CoFe or some other magnetic material.

The layer 308 is formed of an alloy of FeRh or Fe(RhM) that has the advantageous property that it transitions from antiferromagnetic to ferromagnetic as the temperature is increased to a transition temperature $T_N$(AF-F transition temperature). This FeRh transition occurs over an extremely small temperature range and happens extremely quickly, on the order of picoseconds. FeRh or Fe(RhM) alloys with this property are substantially in the body-centered cubic phase and are substantially chemically ordered.

Thus layer 308 is preferably formed of $Fe_x(Rh_y, M_{100-y})_{100-x}$ where (0<=y<=15) and where the value of x is selected so that Fe(RhM) or FeRh (if y=0) is substantially in the bcc phase. Fe atoms occupy the cube corners, Rh atoms occupy the cube centers. In Fe-rich alloys certain of the Rh atoms are substituted by Fe atoms, and for Rh rich alloys certain of the Fe atoms are substituted by Rh atoms. According to the phase diagram $Fe_xRh_{100-x}$ alloys exhibit a single bcc phase for 48.5<=x<=55, and a two phase mixture for 33<=x<=48.5. Thus for the present invention it is believed that the FeRh or Fe(RhM) alloy will have a sufficient amount of bcc phase material to exhibit the antiferromagnetic to ferromagnetic transition if x is approximately the range of 40<=x<=55. The FeRh or Fe(RhM) alloy becomes substantially chemically ordered for example by deposition at an elevated temperature or by post-deposition annealing.

The second magnetic layer 304 includes a pinning layer 314, and may also include a ferromagnetic layer 316 comprising a high spin polarization material such as CoFe, a full or half Heusler alloy such as NiMnSb, PtMnSb, or other high spin polarization material on top of the barrier layer 306 to improve spin dependent tunneling performance of the sensor 202. The pinning layer 314 is preferably a high coercivity hard magnetic material such as CoCr or CoPtCr containing alloys, CoPt or CoPd alloys, chemically ordered $L1_0$ alloys such as CoPt or FePt, CoPd, or FePd or alloys thereof with c-axis in the plane. Other suitable materials are alloys with a hexagonal crystal structure such as CoPt, CoPtCr, or CoPtCrB, or other Co or Fe based alloys with anisotropy constant sufficient to stabilize the bit against thermal fluctuation.

The high coercivity of the pinning layer 314 keeps the magnetization of the magnetic layer 316 oriented in a desired direction, such as indicated by way of example by arrow 318. The pinning layer 314 could also be constructed of an antiferromagnetic material (AFM) such as PtMn, IrMn, FeMn, NiMn or some other antiferromagnetic material, which could then be exchange coupled with the magnetic layer 316 to strongly pin the magnetization thereof. The pinning of layer 314 or the bilayer comprising 314 and 316 is that strong that it will not reverse when the cell is heated above the FeRh or Fe(RhM) transition temperature for writing Although shown as a single layer of high spin polarization material such as CoFe, the ferromagnetic layer 316 of the second magnetic layer structure 304 could be a multilayer structure having a layer of ferromagnetic material such as a hard magnetic material adjacent to the pinning layer and a layer of high spin polarization magnetic material such as CoFe adjacent to the barrier layer, similar to the structure discussed with reference to the first magnetic layer structure 302.

Below the AF-F transition temperature of the FeRh or Fe(RhM) the switching field $H_0$ of layers 302 is $$H_0 = \frac{K_{U,FM}}{M_{S,FM} \cdot t_{FM}}$$

Here, $K_{U,FM}$, $M_{S,FM}$, and $t_{FM}$ are the magnetic anisotropy, saturation magnetization and thickness of the magnetically hard layer 310 or the bilayer comprising the magnetically hard layer 310 and the high spin-polarization layer 312.

The switching field is sufficiently high so that stray magnetic fields from write currents to other cells will not reverse its magnetization.

For writing the bilayer 302 comprising the FeRh layer 308 and the magnetically hard layer 310 is heated to a write temperature $T_W$, where $T_N < T_W < T_{C-FeRh}$, where the FeRh is ferromagnetic, significantly lowering the coercive field of the magnetically hard layer 310 via an exchange spring mechanism. The magnetization of the magnetic layer 310 and spin polarization layer 312 can then easily be changed by a magnetic field from the word and bit lines 204, 206. The heat used to raise the temperature of the cell 202 above the FeRh AF-F transition temperature can be supplied by conducting a current through either or both of the word and bit lines 204, 206. Alternatively, heat can also be supplied from an external source such as a laser or a resistive heater (not shown).

For thin layers (less than roughly the exchange length of the materials) the expected write field is simply given by the weighted average $$H_0 = \frac{K_{U,FM} \cdot t_{FM} + K_{U,FeRh} \cdot t_{FeRh}}{M_{S,FM} \cdot t_{FM} + M_{S,FeRh} \cdot t_{FeRh}} \approx \frac{K_{U,FM} \cdot t_{FM}}{M_{S,FM} \cdot t_{FM} + M_{S,FeRh} \cdot t_{FeRh}}.$$

Here, $H_0$ is the switching field of the bilayer 302, $K_{U,FM}$, $M_{S,FM}$, and $t_{FM}$ are the magnetic anisotropy, saturation magnetization and thickness of the magnetically hard layer 310, $K_{U,FeRh}$, $M_{S,FeRh}$, and $t_{FeRh}$ and are the magnetic anisotropy, saturation magnetization, and thickness of the FeRh layer 302. Since the magneto-crystalline anisotropy of FeRh layer 308 is small compared to that of the high anisotropy layer 310, but the saturation magnetizations of the FeRh layer 308 and the high anisotropy layer 310 typically are of comparable size, the additional moment provided by the FeRh effectively helps with the magnetization reversal of the high anisotropy layer 310 at temperatures well below the $T_C$ of the latter. The data is then stored at a temperature, $T_S<T_N$, where FeRh is in its antiferromagnetic state and the thermal stability of the written magnetization of the free layer is determined by the high anisotropy layer 310. Moreover, the stability of the written magnetization may be further stabilized by the exchange interaction of the antiferromagnetic FeRh with the magnetic layer 310, which in turn strongly pins the magnetization of the high spin polarization layer 312.

Immediately upon reaching the AF-F transition temperature the FeRh layer upon heating it becomes ferromagnetic and this pinning is removed. As can be seen with reference to FIG. 4 which shows the relationship between temperature and magnetic moment, pure FeRh has an antiferromagnetic to ferromagnetic (AF-F) transition temperature of about just above 300 Kelvin or about 320 Kelvin. This temperature is much lower than the blocking temperatures associated with antiferromagnetic materials such as IrMn or PtMn, making the use of FeRh very practical for use in the heat assisted memory cell of the present invention.

Figure 4:
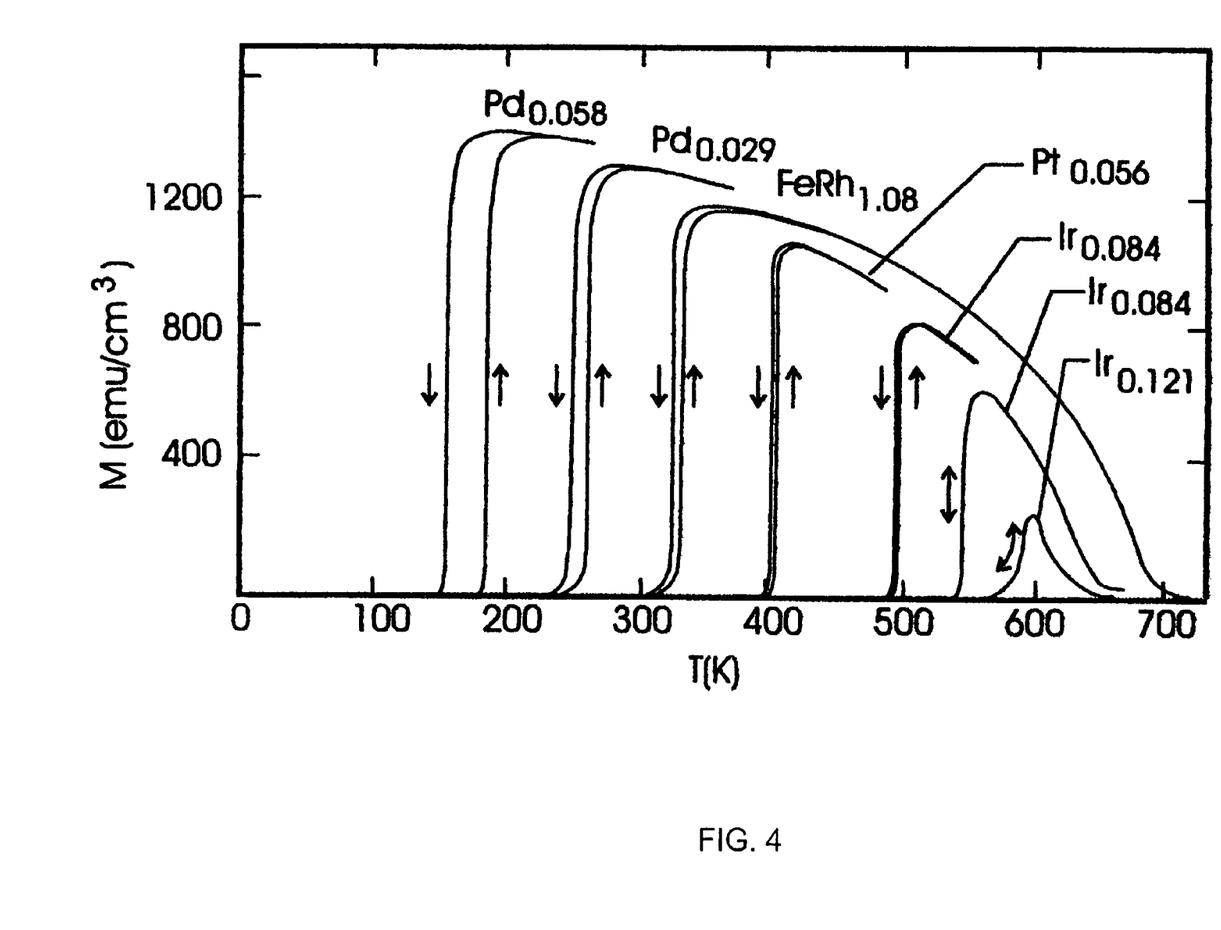
FIG. 4 is a graphical representation of the relationship between magnetic moment and temperature for various materials including FeRh.

Furthermore, as can be seen with reference to FIG. 4 the transition temperature can be changed or "tuned" to fit design requirements by adding certain other elements. For example the transition temperature can be reduced to for example about 240 Kelvin by the addition of 2.9 atomic percent Pd or to about 150 to 180 Kelvin by the addition of 5.8 atomic percent palladium. Conversely, the transition temperature can be increased by the addition of a material such as Pt or Ir. For example the addition of about 5.6 atomic percent Pt can raise the transition temperature to about 400 Kelvin. The addition of about 8.4 atomic percent Ir can raise the transition temperature to about 500 Kelvin. As can be seen by the steep, narrow hysteresis curves at the transition temperature location, the transition occurs over a very short temperature and time span.

With continued reference again to FIG. 3, in order to switch the memory state of the memory cell 202, heat is first supplied to the memory cell 202 to raise its temperature above the FeRh AF-F transition temperature $T_N$.

Just as the coincidence of magnetic fields from word and bit line can be used to select a particular cell for writing, the coincidence of heating from the two lines can be used to select a cell for thermal writing above the FeRh AF-F transition. Thus current is conducted through the word line 204 and bit line 206 associated with the particular memory cell 202 to be written. Current 320 and 326 in the bit and word line lines flow in directions so that the coincidence of their magnetic fields 322 and 328 at the cell can reverse the magnetization of layer 310 as the cell is heated above the FeRh AF-F transition temperature $T_N$. If the initial magnetization state of layer 310 is, for example to the right as indicated by arrows 324, then the magnetic field generated by the coincidence of currents 320 and 326 is oriented counter to the initial magnetization state 324 and will cause the magnetic state to flip, for example to the left.

Alternatively, writing can be accomplished by first passing a heating current pulse through the memory cell. Then, currents can be passed through the word line 204 and bit line 206 that are associated with the cell in directions so that the coincidence of their magnetic fields can reverse the magnetization 324 of layer 310. Moreover heating can also be achieved by external heat sources such as a laser or a resistive heater.

Once the memory state has been changed, the temperature of the cell 202 can be lowered back below the transition temperature of the FeRh, and the antiferromagnetic FeRh layer will pin the magnetization of the first magnetic layer structure 302, thereby assuring that the magnetic state remains fixed as long as desired. This provides an extremely robust, non-volatile magnetic memory system. In order to read the memory state, the resistance across the memory cell 202 is measured by applying a voltage across the memory cell between the word line 204 and bit line 206. The current flowing through the cell for read operation is low enough to keep the cell below the FeRh transition temperature.

While the structure in FIG. 3 has the first magnetic layer 302 below the barrier and the second magnetic layer 304 above the barrier, these layers could be reversed, in which case the order of the layers within 302 and 304 also has to be reversed. Also, some of the ferromagnetic layers 310, 312, 314, and 316 can be antiparallel coupled (AP-coupled) or antiparallel pinned (AP-pinned) structures as described in U.S. Pat. No. 5,465,185. In such a structure, a pair of ferromagnetic layers are separated by a non-magnetic, electrically conductive coupling layer. The thickness of the coupling layer is chosen so that the magnetic moments of each of the ferromagnetic layers will be antiparallel to one another. This structure can minimize magnetostatic coupling of the first and second magnetic layer 302 and 304.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A magnetic memory cell for use in a magnetic random access memory array, the memory cell comprising:
   a first magnetic layer structure having a magnetization;
   a second magnetic layer structure having a magnetization; and
   a barrier layer sandwiched between said first and second magnetic layer structures;
   a first layer of antiferromagnetic material having a first blocking temperature exchange coupled with the first magnetic layer structure such that the first layer of antiferromagnetic material pins the magnetization of the first magnetic layer structure; and
   a second layer of antiferromagnetic material comprising FeRh having a second blocking temperature lower than the first blocking temperature exchange coupled with the second magnetic layer structure such that the second layer of antiferromagnetic material pins the magnetization of the second magnetic layer structure when the memory cell is below the second blocking temperature and leaves the second magnetic layer structure free to move in response to the memory cell is raised to a temperature between the first and second blocking temperatures;
   wherein said second magnetic layer includes a first sub-layer formed adjacent to the FeRh layer and a second sub-layer formed adjacent to the barrier layer, the first sub-layer comprising a material selected from the group consisting of FePt, CoPt, FePd, and CoPd, the second sub-layer comprising a material selected from the group consisting of Co, Fe, Ni and their alloys.

2. A magnetic memory cell as in claim 1, wherein said second magnetic layer structure a first sub-layer adjacent to said FeRh layer and a second sub-layer adjacent to the barrier layer and wherein the second sub-layer comprises a material selected from the group consisting of Co, Fe, Ni and their alloys.

3. A magnetic memory cell as in claim 1, wherein said second magnetic layer comprises FePt, CoPt, FePd, or CoPd alloys.

4. A magnetic memory cell as in claim 1, wherein said second magnetic layer structure comprises a second layer of ferromagnetic material and third layer of high coercivity magnetic material exchange coupled thereto.

5. A magnetic memory cell as in claim 1, further comprising a word line electrically connected with a first end of said memory cell and a bit line electrically connected with a second end of said memory cell opposite said first end.

6. A magnetic memory cell as in claim 1 wherein said second layer of antiferromagnetic material further comprises Ir.

7. A magnetic memory cell as in claim 1 wherein said second layer of antiferromagnetic material further comprises Pt.

8. A magnetic memory cell as in claim 1 wherein said second layer of antiferromagnetic material further comprises Pd.

9. A magnetic memory cell as in claim 1 wherein said second layer of antiferromagnetic material further comprises M, where M comprises an element selected from the group consisting of Ir, Pt, Ru, Re, Pd or Os.

10. A magnetic memory cell as in claim 9 wherein said second layer of antiferromagnetic material comprises $Fe_x(Rh_{100-y}M_y)_{100-x}$ where ($0<=y<=15$) and ($40<=x<=55$).

11. A magnetic memory cell as in claim 1 wherein said first magnetic layer comprises a hard magnetic material.

12. A magnetic memory cell as in claim 1 wherein said first magnetic layer comprises FePt.

13. A magnetic memory cell as in claim 1 wherein said first magnetic layer comprises CoPt.

14. A magnetic memory cell as in claim 1 wherein said second magnetic layer structure comprises:
 a second ferromagnetic layer;
 a third ferromagnetic layer; and
 a non-magnetic antiparallel coupling layer separating said second and third ferromagnetic layers from one another, said second and third magnetic layers being antiparallel coupled across said antiparallel coupling layer.

15. A magnetic memory cell as in claim 14, wherein said second and third ferromagnetic layers comprise CoFe.

16. A magnetic memory cell as in claim 14 wherein said non-magnetic coupling layer comprises Ru.

17. A magnetic memory cell as in claim 14 wherein said non-magnetic coupling layer comprises Cr.

18. A magnetic memory cell as in claim 14 wherein said non-magnetic coupling layer comprises Rh.

19. A magnetic memory cell as in claim 14 wherein said non-magnetic coupling layer comprises Ir.

20. A magnetic memory cell as in claim 1 wherein said first magnetic layer structure further comprises a layer of CoFe formed adjacent to said barrier layer.

21. A magnetic memory cell as in claim 1 wherein said second magnetic layer structure comprises a layer of CoFe formed adjacent to said barrier layer.

22. A magnetic memory cell as in claim 1, wherein at least one of said first and second magnetic layer structures comprises a layer of a Heusler alloy formed adjacent to said barrier layer.

23. A magnetic memory cell as in claim 1, wherein at least one of said first and second magnetic layer structures comprises a layer of NiMnSb formed adjacent to said barrier layer.

24. A magnetic memory cell as in claim 1, wherein at least one of said first and second magnetic layer structures comprises a layer of PtMnSb formed adjacent to said barrier layer.

25. A magnetic memory cell as in claim 1, wherein said barrier layer comprises a non-magnetic, electrically conductive material.

26. A magnetic memory cell as in claim 1, wherein said barrier layer comprises $Al_2O_3$.

27. A magnetic memory cell as in claim 1, wherein said first magnetic layer includes first and second ferromagnetic sub-layers antiparallel coupled with one another.

28. A magnetic memory cell as in claim 1, wherein said second magnetic layer includes first and second ferromagnetic sub-layers antiparallel coupled with one another.

* * * * *